US005317305A

United States Patent [19]

Campman

[11] Patent Number: 5,317,305

[45] Date of Patent: May 31, 1994

[54] PERSONAL ALARM DEVICE WITH VIBRATING ACCELEROMETER MOTION DETECTOR AND PLANAR PIEZOELECTRIC HI-LEVEL SOUND GENERATOR

[76] Inventor: James P. Campman, P.O. Box 167, Transfer, Pa. 16154

[21] Appl. No.: 828,170

[22] Filed: Jan. 30, 1992

[51] Int. Cl.[5] .................... G08B 23/00; H01L 41/04

[52] U.S. Cl. .................... 340/573; 310/321; 340/691; 340/384.73; 381/159

[58] Field of Search .................... 340/573-574, 340/669, 384 E, 593-594, 566, 636, 691; 200/61.45 R, 61.48; 310/321-325; 73/517 AV; 128/782; 338/43, 47; 2/5, 7, 8; 331/64-66; 381/159

[56] References Cited

U.S. PATENT DOCUMENTS

| | | | |
|---|---|---|---|
| 3,113,223 | 12/1963 | Smith et al. | 310/329 |
| 3,456,134 | 7/1969 | Ko | 310/329 |
| 3,614,763 | 10/1971 | Yannuzzi et al. | 340/573 X |
| 3,761,956 | 9/1973 | Takahashi et al. | 310/8.2 |
| 4,051,397 | 9/1977 | Taylor | 310/351 |
| 4,121,160 | 10/1978 | Cataldo | 340/573 X |
| 4,240,002 | 12/1980 | Tosi et al. | 310/324 |
| 4,253,095 | 2/1981 | Schwarz et al. | 340/691 |
| 4,418,337 | 11/1983 | Bader | 340/571 |
| 4,441,370 | 4/1984 | Sakurada | 73/651 |
| 4,467,235 | 8/1984 | DeWames et al. | 310/313 D |
| 4,604,606 | 8/1986 | Sweany | 340/384 E |
| 4,712,098 | 12/1987 | Laing | 340/669 |
| 4,907,207 | 3/1990 | Moeckl | 367/140 |
| 4,914,422 | 4/1990 | Rosenfield et al. | 340/573 |
| 4,926,159 | 5/1990 | Bartlett | 340/384 E |
| 4,979,219 | 12/1990 | Lin | 381/190 |
| 5,006,832 | 4/1991 | Beaudry | 340/574 |

FOREIGN PATENT DOCUMENTS

| | | | |
|---|---|---|---|
| 907950 | 2/1954 | Fed. Rep. of Germany | 310/329 |
| 214030 | 9/1984 | German Democratic Rep. | 310/329 |
| 57-11600 | 1/1982 | Japan | 310/329 |
| 1-233493 | 9/1989 | Japan | 310/324 |
| 230524 | 1/1944 | Switzerland | 310/329 |

OTHER PUBLICATIONS

Published Article "Tiny Accelerometer Weighs Just One Gram"-Design News of Feb. 1, 1988, pp. 68 and 69.

*Primary Examiner*—Thomas Mullen
*Attorney, Agent, or Firm*—Nies, Kurz, Bergert & Tamburro

[57] ABSTRACT

A personal alert safety system, having visual and audio safety components, in a small, lightweight, high impact casing with two compartments separated by a planar wall providing a watertight wall between the two compartments, the planar wall being a sealed laminated piezoelectric sound transducer. One of the compartments is sealed to provide a watertight chamber containing the electronic and electrical control and operating circuitry for the system. The second compartment is a resonating chamber with sound ports for the piezoelectric sound generating transducer. Two manual switch operators are located on opposite exterior sides of the casing and in a sealed manner actuate switches in the interior circuitry to turn the unit on and off, and simultaneous operation of both switches is required to turn the system "on" or "off". A vibrating accelerometer motion detector is included within and connected with the circuitry inside of the casing. There are several embodiments of each of the planar sound transducer and the vibrating accelerometer motion detector.

21 Claims, 4 Drawing Sheets

PERSONAL ALARM DEVICE WITH VIBRATING ACCELEROMETER MOTION DETECTOR AND PLANAR PIEZOELECTRIC HI-LEVEL SOUND GENERATOR

The present invention pertains to a small, lightweight personal alert safety system (Acronym is PASS) which has a self-contained battery powered electrical and electronic circuit with improved motion detector and improved hi-level sound generator transducer, among other components, in a small casing for use by personnel working in dangerous environments, e.g., firefighters and rescue workers and the like.

My companion Design application Ser. No. 796,235, filed on Nov. 22, 1991, now U.S. Pat. No. 336,052 is entitled CASING FOR A PERSONAL ALARM SIGNALING SYSTEM and discloses the external casing configuration for the present invention.

BACKGROUND OF THE INVENTION

The purpose of the PASS alarm is to sound a loud, highly discernible audio alarm if a distressful situation should occur. A PASS alarm can be activated either manually or automatically. When using a PASS alarm in the automatic mode of operation, the alarm will sense the absence of motion if the wearer should become immobilized for a predetermined (25 second) time period. The alarm will then sound a loud, easily recognized audio alarm that will not turn itself off unless it is manually reset. This sound serves as an audio beacon that aids others in finding the downed person (fireman). PASS alarms may also be manually activated to summon help. The devices are normally attached to a SCBA harness, a turnout coat or other protective clothing. A PASS alarm can be a lifesaving device when used properly by personnel involved in hazardous occupations such as firefighting.

DESIRABLE FEATURES

PASS devices must be highly reliable and easy to operate. The demand for lighter, smaller and more reliable PASS devices and equipment is an ever-pressing issue for today's modern fire fighter. Features that must be considered are: SIZE, SHAPE and WEIGHT; SOUND INTENSITY and TYPE of Sound; MOTION Detectors; Signal Processing; Temperature Alarms; Visual Indicators; Manual and Automatic Switching; and Attachments.

The PASS should have a small, lightweight, low profile shape with no sharp corners. Generally smaller physical size is more desirable, provided there is no reduction in sound output. PASS devices that are currently available range in weight from 7 ounces to 13 ounces and exhibit sound intensities that range from 95 dBA through 101 dBA (dBA—unit of sound pressure related to loudness) at ten feet. The primary objective of a PASS device is to provide a loud, highly discernible sound that is easily heard and recognized under high ambient noise conditions. Two important parameters of sound that must be considered are sound loudness (intensity) measured in dBA and sound discernibility (the ability to recognize a particular sound in a high background noise environment). Some of the earlier PASS devices had a loud sound output (high dBA), but it was difficult to distinguish the source of the sound, and thus it was easily confused with smoke alarm sounds or other coherent sound sources. Present day PASS devices have overcome the problem of locating the source from which the sound signal is originating by modulating a pure tone or generating a sound that consists of several intermittent tones. Another, and possibly the most desirable audio sound, is that of a sweep frequency (most discernible). This type of sound will generate multiple tones that sweep from two thousand cycles through six thousand cycles. It is not easily masked by background noise. The actual sound generators are usually of the piezoelectric type and are considered the best means for generating high sound levels.

Manufacturers of PASS devices provide features as defined by the NFPA standard 1982, 1988 edition. This standard defines the minimum requirements and specifications for electronic and mechanical characteristics as well as environmental specifications.

The sensor that permits a PASS device to operate when in the automatic mode (responsive to motion or lack of it) is called a motion detector. These motion detectors are an extremely important part of a PASS device. If the sensor is not sensitive enough to sense random motion, the PASS alarm will constantly be going into a prealert condition, becoming an irritation to the wearer of the device. The ideal sensor is one that only requires normal motion to keep the PASS inhibited, yet will be sensitive enough to immediately sense lack of motion when a person is motionless. Some motion sensors that are currently used by manufacturers of PASS devices are mechanical types that depend on movement of a small metal ball to sense motion. This random motion of the ball is then converted into an electrical signal as long as motion exists. Another popular method of sensing motion is accomplished by the closing of a mercury filled switch with respect to motion.

A third and possibly more progressive method involves a solid-state accelerometer device that can sense a broad range of motion and is not position sensitive.

For the system circuitry, most PASS manufacturers use either a custom micro-chip or a micro-processor chip. Some chip functions are timing, automatic low battery sensing alarm, motion signal processing and sound generation. A quartz crystal is sometimes used to insure accurate timing.

Added features in PASS devices, not covered by the NFPA mandate are: high temperature sensing and alarms; visual indicators; switches; and attachment devices.

Heat sensing alarms that are an integrated part of a PASS device, sound an audio alarm, different from the automatic PASS alarm sound, when life threatening temperatures are encountered. Those PASS devices equipped with temperature sensing alarms should only be regarded as a relative indicator that life threatening temperatures may exist, and are not to be interpreted as an absolute indicator. Temperature sensing PASS devices typically operate on an integrated time versus temperature scheme, and are dependent upon the thermal inertia of the PASS device type of heat sensor used, and the logistics at the fire scene. Accuracy at temperatures the heat alarm will sound can vary as much as ±25% because of the aforementioned.

Most PASS devices are provided with a flashing LED indicator. This indicator provides the user with a visual beacon, but perhaps more important, it can serve as an indicator that the PASS electronics are functioning properly. Most manufacturers provide a visual indicator. The most common indicator is a blinking LED or a combination of LED's that are programmed to flash in a wig-wag fashion for ease of recognition.

Some manufactures utilize a mechanical switch to activate their PASS devices. These switches must be reliable and easy to manipulate, even with a gloved hand. A more recent improvement in switching is used in the present invention and is the all-electronic switch (no moving parts).

Attachment devices vary with different PASS manufacturers. Captive clips are designed to fit the SCBA harness. This type of attachment device does not adapt itself for easy attachment to turnout coats and other gear. Other types of attachment devices include D-rings and fast acting grip clips. The grip clip may be considered the most universal since it permits attaching the pass device to clothing, belts or harnesses by affixing itself with a clamp-like "clop" action. All of the aforementioned attachment devices serve the purpose for which they were designed.

Examples of personal alarm devices which show one or more of the aforementioned desirable features can be found in the following United States Patents: U.S. Pat. No. 3,614,763 to A. YANNUZZI for PRONE POSITION ALARM which is in a small case and can be clipped over a belt and uses a motion sensitive mercury switch and a cone type of audio speaker; U.S. Pat. No. 4,253,095 to RAY P. SCHWARZ et al for ALARM APPARATUS FOR DETECTING DISTURBANCE OR OTHER CHANGE OF CONDITION, which also is housed in a small casing and uses an open structure, round piezoelectric element as a sound generator; U.S. Pat. No. 4,418,337 to RAMZI N. BADER for ALARM DEVICE, has a small housing with a solenoid and induction coil type of motion detector, a printed circuit board and horn-shaped speaker for the audio alarm; and U.S. Pat. No. 4,914,422 to DANIEL ROSENFIELD et al for a TEMPERATURE AND MOTION SENSOR, which is in a small casing and provides highly visible green and red colored position indicators for the on-off switch, a temperature sensor, a motion detector (not disclosed) and an audio sound generator which emits different tones for temperature and motionless sensing.

Examples of piezo electric vibrating accelerometers can be found in the following United States Patents: U.S. Pat. No. 3,113,223 to T. D. SMITH et al for BENDER TYPE ACCELEROMETER which uses a piezo element as the motion sensing mass; U.S. Pat. No. 3,456,134 to W. K. KO for PIEZOELECTRIC ENERGY CONVERTER FOR ELECTRONIC IMPLANTS which uses a cantilever mounted crystal strip as the vibrating support for a small weight mass on the end of the strip; U.S. Pat. No. 4,051,397 to A. L. TAYLOR for a TWO DENSITY LEVEL KINETIC SENSOR which uses a piezo electric strip with a weight at one end and the other end is mounted to a planar unit which contacts a unit whose motion is to be sensed; U.S. Pat. No. 4,441,370 to O. SAKURADA for VIBRATION SENSOR which uses a vibrating piezo electric strip; and U.S. Pat. No. 4,712,098 to J. LAING for INERTIA SENSITIVE DEVICE which uses a weighted plate of piezo electric material. None of these patents teach the construction of the several embodiments of the novel vibrating accelerometer construction of this present invention using a weighted ball mass carried by a spring element which transmits vibrations of the ball mass to a vibration detection material.

Examples of piezo electric sound generating transducers can be found in the following United States Patents: U.S. Pat. No. 3,761,956 to N. TAKAHASHI for SOUND GENERATING DEVICE; U.S. Pat. No. 4,240,002 to K. F. TOSI for PIEZOELECTRIC TRANSDUCER ARRANGEMENT WITH INTEGRAL TERMINALS AND HOUSING; U.S. Pat. No. 4,604,606 to L. P. SWEANY for AUDIO SIGNALING DEVICE; U.S. Pat. No. 4,907,207 to T. MOECKI for ULTRA SOUND TRANSDUCER HAVING ASTIGMATIC TRANSMISSION/RECEPTION CHARACTERISTICS. None of the noted patents including the previously noted U.S. Pat. No. 4,253,093 to SCHWARZ et al teach the unique laminated, thin, planar construction of the piezoelectric sound generating transducer of the present invention.

SUMMARY OF THE INVENTION

The present invention is lighter, smaller and more reliable than prior art alarm systems. In addition it features all electronic switching for enhanced reliability. It incorporates novel embodiments of vibrating accelerometers for motion detectors and a novel planar, low profile sealed, piezo, hi-level sound generating transducer structurally and functionally coordinated with resonating chamber casing structure to provide a hi-level audio alarm. The lack of motion alarm sounds a loud, easily recognized, sweep type of signal if the wearer should become motionless. If the wearer is exposed to excess temperature, the system will sound a different kind of easily recognized, constant tone alarm. The alarm sound for lack of motion is thus distinctly different from the alarm sound for excessive temperature.

Accordingly a primary object of the present invention resides in the provision of a novel lightweight, small personal alarm system with plastic casing enclosed electronic circuitry having a novel vibrating accelerometer unit for motion sensing and a novel piezo hi-level low profile planar sound transducer for an audio alarm.

A further object resides in a novel, thin, planar sound generating transducer with planar diaphragm elements bonded together and enclosing in a sealed manner, a piezo electric wafer in a sealed flat air pocket capable of generating an extremely high intensity sound. The objects include two embodiments of sound generating transducers, one having a flat planar laminate of a metal plate bonded to a fiberglass flat diaphragm board, the metal plate having a planar recess holding the piezo wafer and providing the flat sealed air pocket. The second embodiment uses a flat planar laminate of two flat fiberglass diaphragm boards, one having a circular opening therethrough, and both boards being sealed together and having the circular opening covered by a metal disc bonded to sealingly enclose the circular opening providing a sealed air pocket with a piezo wafer bonded to the metal disc within the sealed air pocket. The air pocket uniformly distributes sound energy from the piezo wafer to the flat planar bonded laminates.

A further novel object of the present invention resides in providing the aforementioned small flat planar sound generating transducer in and rigidly secured to the walls of a PASS unit casing to therewith form a resonating chamber for a high intensity audio alarm signal.

Still further objects reside in provision of miniature vibrating accelerometers, as motion detectors in a PASS device, which are based on a spring support carrying a weight mass to provide flexing and vibratory motion of the spring support as a result of motion regardless of position of the accelerometer and providing, connected to the spring support a signal emitting material responsive to vibratory movement of the spring support to generate a changing signal emission indicative of motion of the accelerometer. In connection with this object, further objects reside in novel embodiments of the vibrating accelerometers wherein the signal emitting material is either a piezo ceramic electrical generating layer on a portion of the spring support or the signal emitting material is a fabricated structure of a motion sensing circuit including a voltage source and an electrically conductive variable resistance, the resistance of which changes with flexing caused by vibrating of the spring support to provide a change in the circuit voltage indicative of changing motion.

A still further object resides in provision of a vibrating accelerometer, as noted in the previous objects, in the operating circuit for a PASS device in accord with this invention, as well as incorporation with a PASS device using as a sound generator the planar sound transducers as noted in the foregoing objects.

Further novel features and other objects of this invention will become apparent from the following detailed description, discussion and the appended claims taken in conjunction with the accompanying drawings.

BRIEF DESCRIPTION OF DRAWINGS

A preferred structural system embodiment and preferred sub-components of this invention are disclosed in the accompanying drawings in which.

DESCRIPTION OF THE PREFERRED EMBODIMENTS

Figure 1:
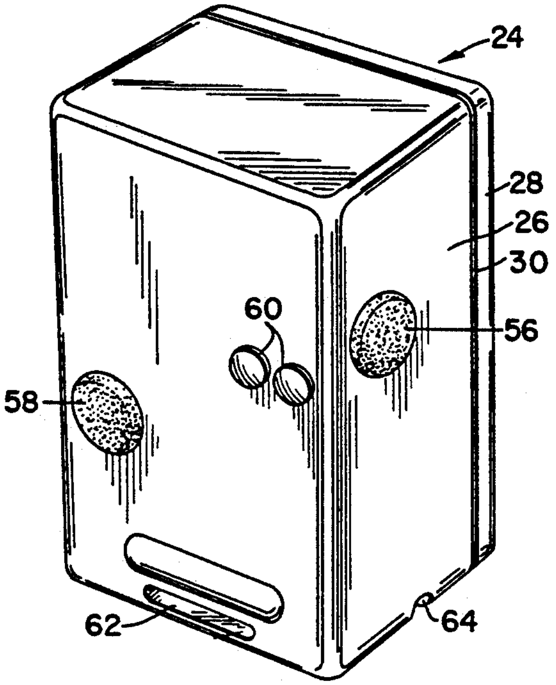
FIG. 1 is a front perspective view of the personal alarm device of this invention showing the exterior of the casing and some of the components of the alarm device.
Figure 2:
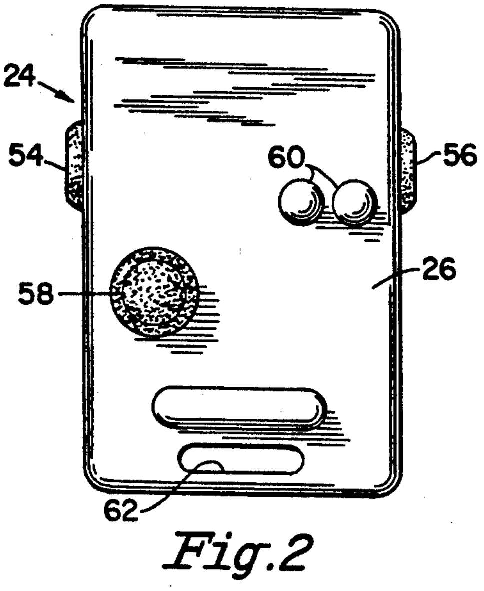
FIG. 2 is a front elevation view of the alarm device shown in FIG. 1.

The PASS alarm unit illustrated in FIGS. 1–6 is particularly adapted to provide a loud audible signal if the wearer becomes immobilized or motionless for a predetermined time period, e.g., for a 25 second time period. The alarm can be heard for a distance of one half mile or more. The same alarm can be manually activated as a call for help. If desired, an alarm system can be incorporated to include a circuit (as described) to respond to excessive temperature and will provide a different sound than the sound for lack of motion or call for help.

As will be described, other features are incorporated in the alarm unit for safety, e.g., means to deactivate an alarm and means to avoid accidental activation.

The PASS unit 24, clearly illustrated in FIGS. 1–5, is enclosed in a small size, multiple part waterproof case 24 made from high impact polycarbonate plastic, the dimensions of which are approximately 2" wide × $3\frac{1}{4}$" high × $1\frac{1}{2}$" deep. With battery, it weighs about six ounces. Case 24 has a main cup shaped front part 26 which encloses a battery, the electronic circuitry, the detectors and sound transducer, which are assembled into the case from the rear side, see FIG. 6B. The case is closed by an outside rear cover 28 which clamps an elastomeric, peripherally flat, gasket 30 against the peripheral back edge 32 (see FIGS. 6A and 6B) of the front cup-shaped part 26. Back cover 28 is secured by four screws 34 which screw into embedded nut bodies 36 molded into integral reinforcing ribs 38 in the front part 26 (see FIG. 6B).

An internal back cover 40 (see FIG. 6A), made from the same kind of plastic as the case, is fitted into the back of the front part 26 and sealed in place by suitable waterproof adhesive, or glue, to enclose the interior electronic parts. The interior cover has a pocket recess 42 which provides a receptacle for the 9V. battery 44 that powers the unit. A standard 9 volt double terminal snap connector 46, connected to the internal electronic circuitry by wires 48 leading through an aperture in the base of the pocket 42 provides the electric connection to battery 44. An adhesive is applied where the wires pass through the pocket wall to seal the passage in a waterproof manner.

Figure 3:
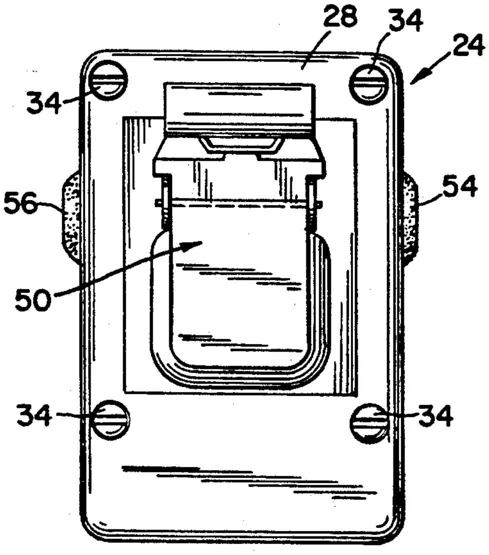
FIG. 3 is a rear elevation view of the alarm device shown in FIG. 1.
Figure 4:
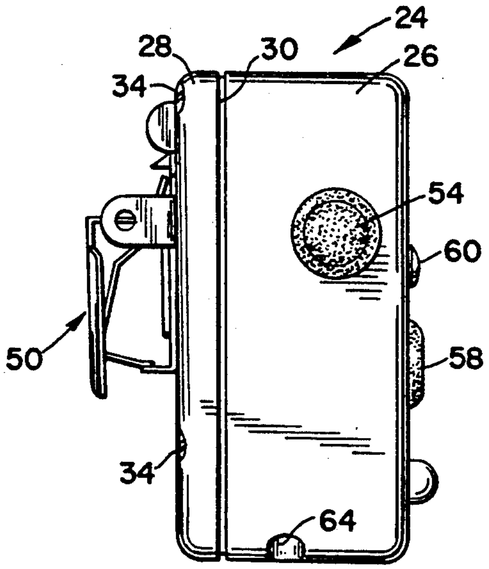
FIG. 4 is a right side elevation view of the device shown in FIG. 1.
Figure 5:
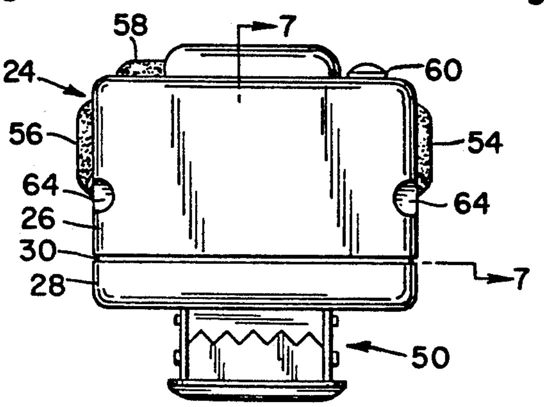
FIG. 5 is a bottom plan view of the device shown in FIG. 1.

Various types of commercially available attachment devices can be fastened to the unit 24 to enable the unit to be secured to clothing or a harness on the wearer, e.g., rings, captive clips and quick clamping grip clips, the latter being illustrated in FIGS. 3, 4 and 5 as grip clip 50.

Some of the external features which can be seen in FIGS. 1-5 are the safety activator/deactivator buttons 54 and 56, the emergency call button 58, lens 60 for emergency visual wig-wag signal and front 62 and side 64 sound and drain ports. Activator buttons 54, 56 and 58 are elastomeric flat grommet-like plugs which are placed into apertures in the walls of the front casing part 26 and provide a sealed fit. The buttons engage the actuators of micro-switches PB1, PB2 and PB3 (see FIG. 22) secured on the printed circuit board of the electronic circuitry which control the system, as will be described hereinafter with reference to FIG. 22. The two buttons 54 and 56, located on opposite sides of the case 26, must be simultaneously depressed to turn the unit "on" and place it in an automatic mode. To turn the unit "off", both buttons 54 and 56 must again be simultaneously depressed. The location of the buttons 54 and 56 effectively negates accidental operation of the unit to either an "on" or "off" automatic mode. While in the automatic mode, an emergency call signal can be activated by pressing button 58. The emergency call alarm, when activated, will remain on until the two side buttons 54 and 56 are simultaneously pressed to intentionally turn the system "off".

Two plastic lens 60, secured by adhesive into two apertures in the front of the front case part 26, are in line with two LED's (D9 and D10 in FIG. 22) secured on the interior printed circuit board. When activated into the automatic mode, the two LED's will flash, through lens 60, in a wig-wag high intensity visual red flash beacon signal which can aid rescue personnel in locating a victim needing aid.

The slotted front wall port 62 and the two circular side wall ports 64 serve as part of the high intensity sound alarm system which will be described hereinafter in detail. The ports 62 and 64 also enable excellent drainage of any water that may enter the lower sound cavity in situations which the wearer may encounter.

MOTION DETECTOR

To detect motion (or lack of motion) of a wearer of the PASS device, this invention incorporates a novel vibrating accelerometer, several embodiments being disclosed and described with reference to FIGS. 12-21. A Vibrating Accelerometer is a highly sensitive motion detector that will sense motion in all planes of movement. High sensitivity, rugged construction and ability to sense omni-directional motion are characteristic of the new embodiments which are described as follows.

Figure 15:
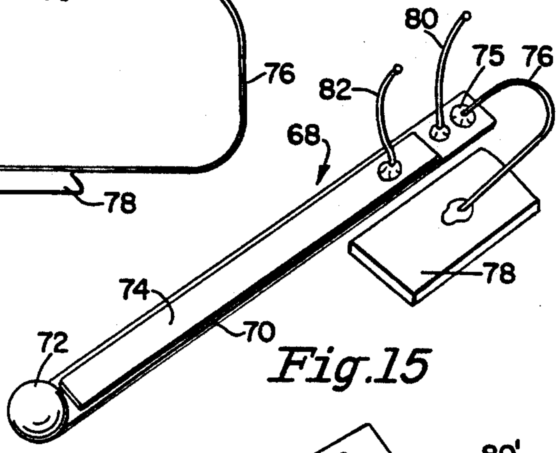
FIG. 15 is an enlarged perspective view of the accelerometer shown in FIG. 6 and FIG. 12.
Figure 13:
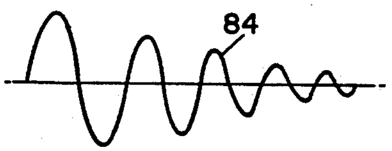
FIGS. 13 and 14 illustrate a sine wave and square wave signal pulse train respectively, which represent voltage output generated and processed from the accelerometer shown in FIG. 12.
Figure 14:
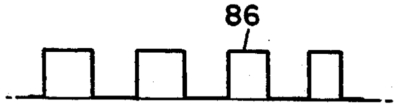
Figure 16:
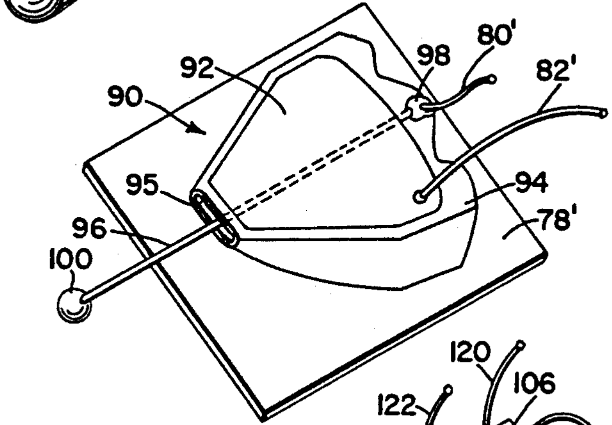
FIG. 16 is an enlarged perspective of an alternative embodiment of a vibrating accelerometer using piezo crystal material.

The vibrating accelerometers of FIGS. 15 and 16 are two embodiments which utilize the characteristic of piezo electric material to generate a voltage when caused to flex by vibration caused by motion. A third embodiment, shown in FIGS. 17-21, utilizes a change in conductivity resulting from changes of force caused by flexing motion.

All three embodiments of the vibrating accelerometer use a small ball mass on a lever arm which is a metal strip and/or a wire which is made of spring steel. In turn the assembly is mounted on a rigid substrate. When motion occurs, the ball mass moves and relative to the rigid substrate causes the lever arm and spring wire to vibrate in a simple harmonic motion.

In the piezo electric types of motion detectors, a piezo electric material is bonded to the lever arm or to a thin metal plate part of a frame mounted on a rigid substrate and to which the lever arm is connected. When motion occurs, the lever arm, described by mass ball and lever arm (with thin plate), causes the metal arm (plate) to flex. This arm or plate flexing causes a piezo electric voltage to be generated between the piezo ceramic material and the arm or the frame assembly. Because the metal ball mass is free to move in any direction, the configuration described will generate a voltage if movement should occur in any plane of movement. The amount of sensitivity and the frequency of the harmonic motion (natural vibrating frequency of ball and lever mass) can easily be adjusted by changing the ball mass and lever arm. The voltage that is generated between conductors is a dampened sine wave that can easily be processed into a pulse train in appropriate circuitry which will be described.

In the vibrating accelerometer embodiment which utilizes change in conductivity with changes in force, a ball mass is secured on the end of a lever arm which is spring mounted to a rigid substrate. Resistive material is bonded to the lever arm. A voltage is applied between spaced apart locations points on the resistive material. When a vibration of the ball mass and lever arm occurs because of motion, the flexing of the lever causes compression movements in the resistive material which results in a change in its conductivity. The change in conductivity results in a sine wave that as in the previous embodiments can be processed into a pulse train in appropriate circuitry.

In all embodiments, lack of motion for a predetermined time period results in a lack of pulse signals which triggers circuitry to cause the alarm to sound.

FIRST EMBODIMENT—MOTION DETECTOR

Figure 6A:
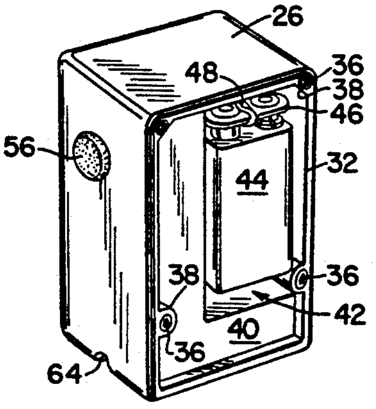
FIG. 6A is a reduced size rear perspective view of the alarm device of FIG. 1 with the rear outer cover removed.
Figure 6B:
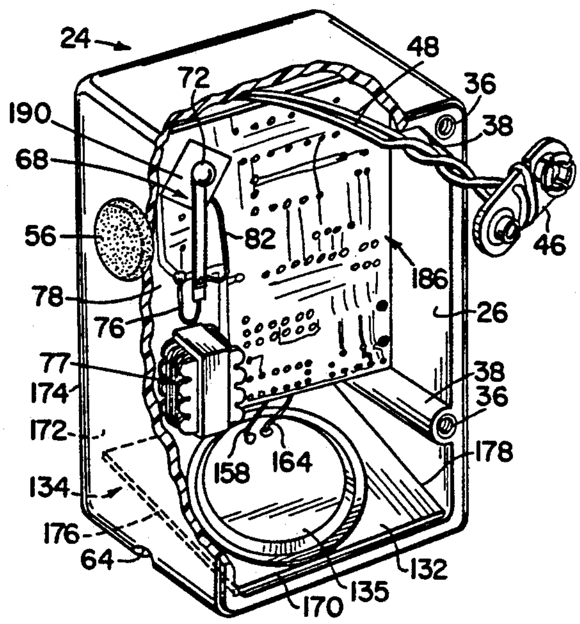
FIG. 6B is a rear perspective view of the alarm device similar to FIG. 6A but with the rear outer cover and the inner compartment cover removed and with the walls partially broken-away to show some of the components of the system.

Referring to FIGS. 12, 13, 14 and 15 the first embodiment of the motion detector is a vibrating accelerometer 68 made with an elongate flat strip 70 of flexible metal substrate, e.g., brass, approximately 1 inch (25 mm.) in length, at one end which is secured, as by soldering, a small weighted ball 72 which will be referred to as a ball mass. Affixed by electrically conductive bonding to the length of the brass strip 70 is a laminate layer of voltage generating piezo material 74. Secured, as by soldering 75, to the end of the brass substrate 70 opposite the ball mass is one end of a U-shape spring steel lever arm 76, whose other end is firmly secured to a rigid base 78. Base 78 in the alarm unit 24, as seen in FIG. 6B, is part of the printed circuit board.

A ground conductor wire 80 is soldered to the brass substrate 70. Alternatively the spring wire arm 76 can be the ground conductor. Another conductor 82 is soldered to the piezo material 74.

The ball mass 72 and brass strip 70 react to motion of the alarm unit 24 and, because of the spring steel wire lever arm 76, such reaction to motion permits the entire assembly 68 to freely move in any direction. This movement causes the detecting assembly, including the brass substrate 70 and the piezo material 74, to vibrate in a simple harmonic motion manner, resulting in a dampened sine wave voltage 84 (FIG. 13) being generated between conductors 80 and 82. This voltage is then electronically processed into a series of square wave pulses 86. As long as the pulses 86 are created then motion is present; when these pulses 86 cease then the motion has ceased.

SECOND EMBODIMENT—MOTION DETECTOR

With reference to FIG. 16, this second embodiment of a vibrating accelerometer motion detector 90 is made with a layer of piezo electric material 92 bonded to a thin wall upper part of a hollow formed, flexible metal (brass) housing 94 with a front opening 95. A metal spring wire 96 projects through opening 95 and has one end attached to the rear upper surface of the metal substrate frame 94 at point 98. At the other end of the spring wire 96, exterior of the frame 94, is attached a mass, (weighted ball) 100. A ground conductor wire 80' is soldered to the hollow metal frame 94 and a second conductor wire 82' is connected by solder to the layer of piezo material 92. The entire assembly 90 is affixed to a rigid base 78'. Note that in this embodiment the amount of movement of ball mass 100 is restricted by the opening 95 of the flexible metal frame 94, which is secured to the rigid substrate 78'. This restriction is sometimes necessary to limit the amount of travel of the ball 100 and will protect the assembly from damage due to a high impact, such as dropping or throwing the alarm unit 24. This type of construction provides an extremely rugged motion sensing device. As in the first embodiment, when motion occurs, ball mass 100 causes wire lever arm 96 and metal frame 94 to vibrate in a simple harmonic motion manner, generating a dampened voltage sine wave between the conductors 80' and 82' which is electronically processed into a series of square wave pulses that are used to determine whether or not motion is present.

THIRD EMBODIMENT—MOTION DETECTOR

With reference to FIGS. 17–21, a third embodiment of a vibrating accelerometer, motion detector 104 is constructed in a manner somewhat like that of the previously described first vibrating accelerometer 68 but it utilizes change in conductivity due to flexing rather than change in piezo material electrical voltage generation due to flexing.

Figure 20:
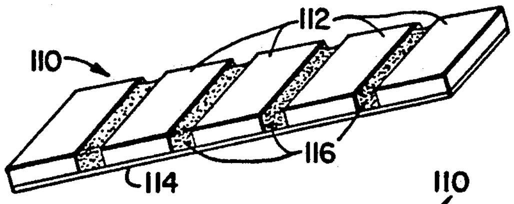
Figure 19:
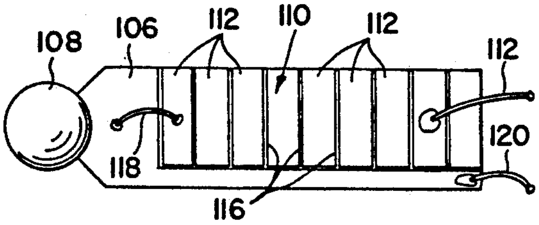

Like motion detector 68, the third embodiment 104 is made with an elongate flat strip 106 of flexible metal substrate, e.g., brass, at one end of which is secured, as by soldering, a small weighted ball 108 which will be referred to as a ball mass. Affixed by electrically non-conductive bonding to the length of the brass strip 106 is a laminated layer of force sensitive resistance material 110. The force sensitive resistive material 110 is a fabricated strip as shown in FIG. 20 made from an aligned plurality of spaced-apart small copper blocks 112 (10 to 15 blocks), bonded in a non-conducting manner to a substrate made from a thin flexible flat strip 114 of non-conductive material, e.g., plastic foil. In a production example, the size of copper blocks was 1 mil.×3 mil×0.3 mil thick. In the space (approximately 0.3 mil.) between, and contacting each adjacent copper block is placed a resistive strip 116 of a hardened mixture of carbon granules bonded together with conductive bonding material. The flexible non-conductive substrate 114 is securely bonded along and to the upper surface of the flexible metal strip 106. The copper block 116 located nearest the ball mass 108 is electrically bonded to the flexible metal strip 106 by any suitable means, e.g., a jumper wire 118, or a small solder joint.

Secured, as by soldering 75', to the end of the brass substrate 106 opposite the ball mass 108 is one end of a U-shape spring steel lever arm 76' whose other end is firmly secured to a rigid base 78''. Base 78'' like base 78 in the alarm unit 24, as seen in FIG. 68, will be a part of the printed circuit board. A ground conductor wire 120 is soldered to the brass strip substrate 106. Another conductor wire 122 is soldered to the copper block 116 located farthest from the ball mass 108.

The ball mass 108 and brass strip 106 react to motion of the alarm unit 24 and, because of the spring steel wire lever arm 76', such reaction to motion permits the entire assembly 104 to freely move in any direction. This movement causes the motion detecting unit including the brass substrate 106 and the motion sensitive resistive strip 110 to vibrate in a simple harmonic motion manner.

Figure 18:
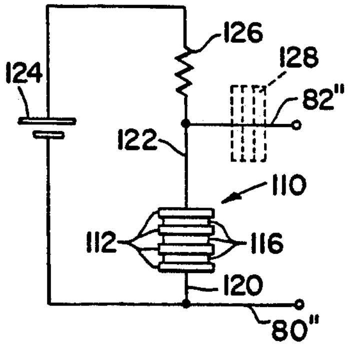
FIGS. 17–21 illustrate enlarged detail views of a third embodiment of a novel vibrating accelerometer using force sensing resistive material to generate a signal when motion occurs.
Figure 17:
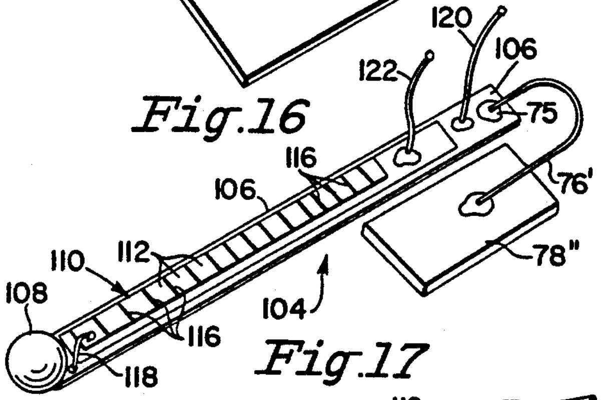
Figure 21:
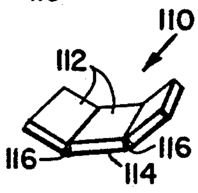

The third embodiment of vibrating accelerometer motion detector 104, which responds to motion forces by changes in conductivity, is much like early telephone transmitters which used carbon granules to generate a changing electrical signal when subjected to changes in sound pressure. This vibrating accelerometer utilizes a simple circuit such as shown in FIG. 18 having a voltage source 124 in series with a fixed resistance 126 connected between the leads 120 and 122 from the variable resistance strip 110 of the assembly 104 (FIG. 17). Leads 120 and 126 of the circuit of FIG. 18 and of the vibrating accelerometer 104 connect to leads 80'' and 82'' which are the equivalent of conductors 80 and 82 of the first embodiment of vibrating accelerometer 68 of FIG. 15. When the fabricated strip 110 (FIG. 20) vibrates, the compression of the resistive material 116 varies as illustrated in FIG. 21 which shows the resistive material under greater compression. When compression of the resistive carbon granules 116 changes the conductivity changes and the voltage output between leads 80'' and 82'' of the divider circuit in FIG. 18 changes. When there is no motion of the alarm device, the voltage output of the motion detector circuit (FIG. 8) is constant and, in an appropriate sensing circuitry, an alarm can be triggered. The third motion detector and circuit can be used in the same unit circuit of FIG. 22 which uses the piezo electric motion detectors of FIGS. 15 and 16 if a capitance coupling is incorporated in the output circuit of leads 80'' and 82''. For example, a capacitor 128 as shown in phantom lines in FIG. 18 can be provided.

SOUND GENERATOR UNITS

Figure 7:
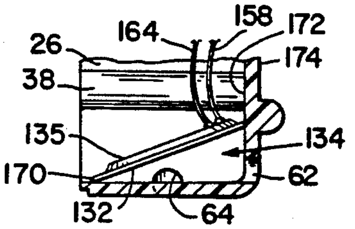
FIG. 7 is a detail section taken on line 7—7 of FIG. 5 across the lower part of the casing showing the sound transducer and the resonating cavity.
Figure 8:
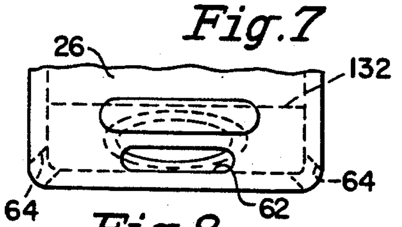
FIG. 8 is a detail diagramatic view of the lower part of the device casing illustrating the sound transducer location relative to the sound ports from the resonating cavity.

To provide means for the audible alarms sounded by the PASS device 24, a novel miniature sound generator has been developed which has the following outstanding characteristics:

(1) It incorporates a flat planar shaped sound generator transducer 132 which has a small physical size of approximately 1.8 inches by 1.0 inch by 3/16 inch thick, capable of generating sound pressures in excess of 120 dBa when housed in a resonating eavity 134 constituted by assembly of the flat transducer within the front part 26 of the unit case as seen in FIGS. 6B, 7 and 8.

(2) An extremely rugged construction which can operate in harsh and hazardous environments.

(3) A totally explosion proof sound generating transducer.

(4) A sound generator transducer that is water proof.

(5) A transducer that can be used for underwater communications or signaling.

(6) A hermetically sealed transducer.

(7) A transducer that has an extremely low profile.

Figure 10:
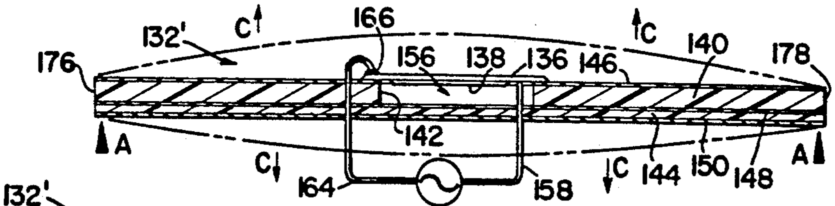
FIG. 10 is an enlarged detail cross-section of the assembled transducer of FIG. 9B to illustrate generation and distribution of sound energy.
Figure 11:
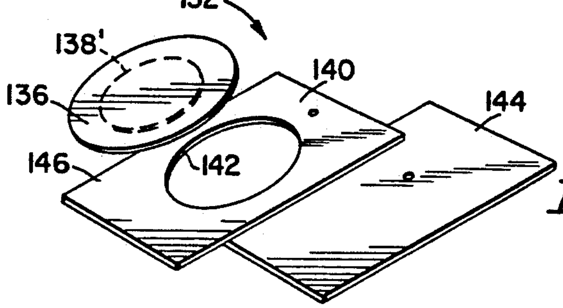
FIG. 11 is an exploded perspective of the planar transducer second embodiment of FIG. 9B.
Figure 12:
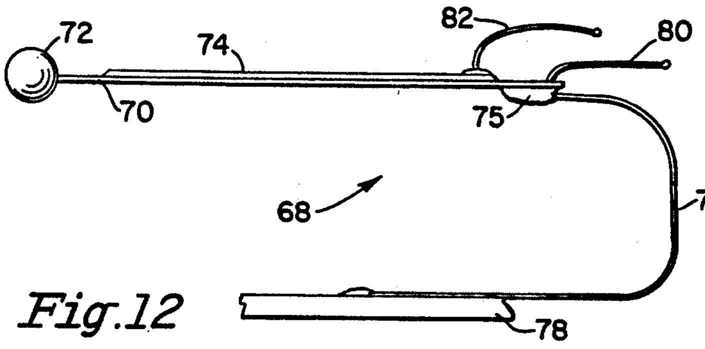
FIG. 12 is an enlarged side elevation detail view of one embodiment of a vibrating accelerometer incorporating piezo crystal material and used as the motion detector invention in the alarm device of FIGS. 1–6.

FIGS. 6B, 7, 8 and 9A illustrate a first embodiment of a piezo type of a flat, thin, planar sound generating transducer 132 installed in the lower portion of the front case part 26, and therewith forms the sound generator resonating cavity 134. FIGS. 9B, 10 and 11 illustrate a second embodiment 132' of the sound transducer of this invention. The two planar sound transducer units 132 and 132' are essentially the same size and both function and generate sound in the same manner, as will be described hereinafter with reference to FIG. 10.

FIRST EMBODIMENT OF PLANAR SOUND TRANSDUCER

Figure 9A:
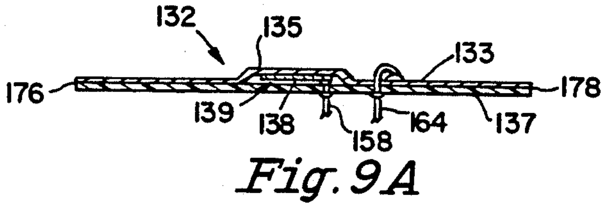
FIG. 9A illustrates an enlarged cross-section of an assembled first embodiment of the planar sound transducer shown in FIGS. 6B, 7 and 8.
Figure 9B:
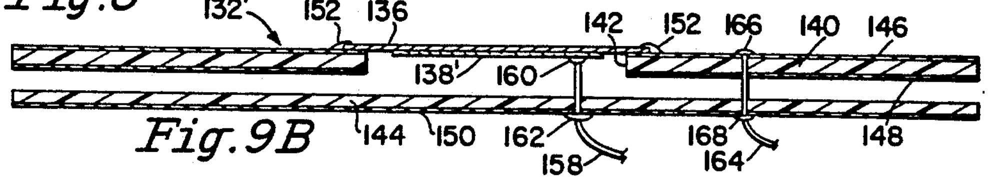
FIG. 9B illustrates a greatly enlarged cross-section of a partially assembled second embodiment of the planar transducer of the invention.

Shown in FIG. 9A, the sound transducer 132 has a brass substrate 133, which is made with a circular depression 135, sandwiched and bonded to a copper clad fiberglass board 137, the bottom of which is also copper clad. In the upperwardly depressed portion 135 of brass plate 133, is electrically bonded a thin circular layer of piezo ceramic material 138 which is slightly smaller in diameter than the diameter of the circular depression 135. The sandwiched planar laminate of the brass substrate 133 and the fiberglass board 137 are shown in FIG. 9A and result in a small air pocket 139 confined between the inverted depression 135 and the lower fiberglass board 137. The thin piezo ceramic layer 138 is bonded to the base of depression 135, which is the roof of the annular air pocket 139, and is spaced-apart from the fiberglass board 137.

Leads 158 and 164 are electrically bonded, by solder, to the piezo layer 138 and the brass substrate 133 respectively and pass through the sandwiched planar brass and fiberglass laminate in a sealed waterproof manner. The air pocket is sealed and insures uniform distribution of sound energy from the piezo layer to the planar assembly.

SECOND EMBODIMENT OF PLANAR SOUND TRANSDUCER

The construction of a second embodiment of my novel planar transducer will be understood with reference to FIGS. 9B and 11 which illustrate sandwiched, laminated planar components of the sound transducer 132' which has a slightly different construction than the sound transducer 132 shown in FIGS. 6B, 7, 8 and 9A. Shown in exploded perspective in FIG. 11, the three basic sandwiched components of transducer 132' are a brass disc substrate 136, on the underside of which is electrically bonded a circular layer of piezo ceramic material 138' of smaller diameter than disc 136, a copper clad fiberglass board 140 with a circular aperture 142 therethrough and a second copper clad base fiberglass board 144. The apertured board 140 can have one or both sides clad with copper layers and the base board 144 can have both or one side clad with copper layers, e.g., board 140 can have copper layers 146 and 148 on two sides and board 144 can have a copper layer 150 on the lower side, so a layer of copper cladding is located on the top and bottom and between the two sandwiched boards 140 and 144.

FIG. 6B shows an intermediate stage of assembly of the planar transducer 132' where the brass disc 136 is securely bonded, as by soldering 152 around its periphery to the copper clad top surface 146 of the apertured board 140 with the circular layer of piezo material 138' disposed within and spaced from the periphery of the circular aperture 142.

The copper layer 146, fiberglass board 140, copper layer 148, fiberglass board 144 and copper layer 150 are securely laminated together with suitably adhesive bonding 154 to provide a sealed planar unit 132', as seen in FIG. 10. Clearly shown in FIG. 10 is a the piezo material 138' facing into a sealed air pocket 156 formed by the circular hole 142, the brass disc 136, and the lower fiberglass board 140. A conductor lead 158' is electrically bonded, as by solder 160 to the piezo material and passes through a small hole in the lower board 144 which is sealed with a waterproof adhesive material 162. A second grounded conductor lead 164' is electrically bonded at 166, as by solder to the top layer copper cladding 146, as in FIG. 9 or to the brass disc 136, as in FIG. 10. Lead 164' passes through holes in both boards and is sealed with waterproof adhesive material 168. Thus the entire planar sound generating transducer unit 132' is sealed in a waterproof manner.

FIG. 11 is an illustration of the sound generating mode of the piezo electric sound transducers and will be used to describe the function of both embodiments which is the same. By impressing an A.C. signal across terminals, the two leads 158 and 164 or 158' and 164', the piezo element 138, 138' and its brass substrate 133, 136 is caused to flex. This piezo element layer and the brass element are rigidly soldered to the copper clad fiberglass substrate 140 in the second embodiment 132', or the piezo layer is integral with brass substrate 133 of the first embodiment 132. Substrate 133 or 140 each of which is bonded to a substrate 137 or 144 is the complete planar transducer assembly 132, 132' which starts to flex about suspension points A and B. Sealed air pocket (138, 156) insures uniform distribution of sound energy from piezo element (138, 138') to the planar transducer assembly. Note that maximum sound pressure (assembly flexure) will occur when the transducer assembly is in resonance with the applied A.C. signal. The dotted lines and arrows C depict flexure motion of the planar assembly. Note also that optimum sound output is obtained only when the planar transducer is housed in the resonating cavity 134 depicted in FIGS. 6B, 7 and 8 and the complete system is tuned for optimum sound output.

FIGS. 6B, 7 and 8 illustrate the mounting of planar transducer 132 into the lower portion of the front part 26 of the unit case. The rectangular transducer 132 is inclined between the rear lower edge 170 of front case part 26 and the inner surface 172 of the lower part of the front wall 174 of the front case part just above the front sound slot port 62. The planar transducer short side edges 176 and 178 snugly abut the side walls of the front case part 26, one long side edge 180 abuts the case front wall 174 and the other long side edge 182 rests on the case bottom wall, just inside of the case bottom edge 170. All four edges 176, 178, 180 and 182 of the planar transducer are rigidly secured by waterproof bonding, e.g., epoxy or RTV, to the front case walls where the transducer abuts the walls to provide a waterproof seal between the lower resonating cavity 134 of the case and the upper chamber of the case which contains the electric and electronic circuits and components, as well as providing the edge suspensions A—A of the planar transducer shown and described in FIG. 10. The extremely high, sound pressure, generation resulting from the flexing planar transducer together with the adjacent resonating cavity 134 result in a highly efficient very small size high level sound, emitting from the sound ports 62 and 64.

ALARM DEVICE CIRCUIT AND OPERATION

Seen in FIG. 6B, a printed circuit board 186 is mounted within the front case part 26 above the planar transducer 132 and between the integral ribs 38. Most of the electrical and electronic components of the operating circuit (FIG. 22) of the alarm device are carried on the front of the circuit board, which is not shown. The back side of circuit board 186 serves as the rigid base 78 which supports the vibrating accelerometer (motion detector 68 being shown), previously described, and its piezo lead 82 and grounded spring support wire are shown attached to the circuit board. A small strip of insulation material 190 is glued on the circuit board under the ball mass 72 as a safety protection against possible short circuits between the ball mass and the printed circuit board. Also shown as connected to the printed circuit board 186 are leads 48 from the 9 volt battery connector clip 46 and leads 158 and 164 from the piezo sound transducer 132 and a coupling transformer T1.

Figure 22:
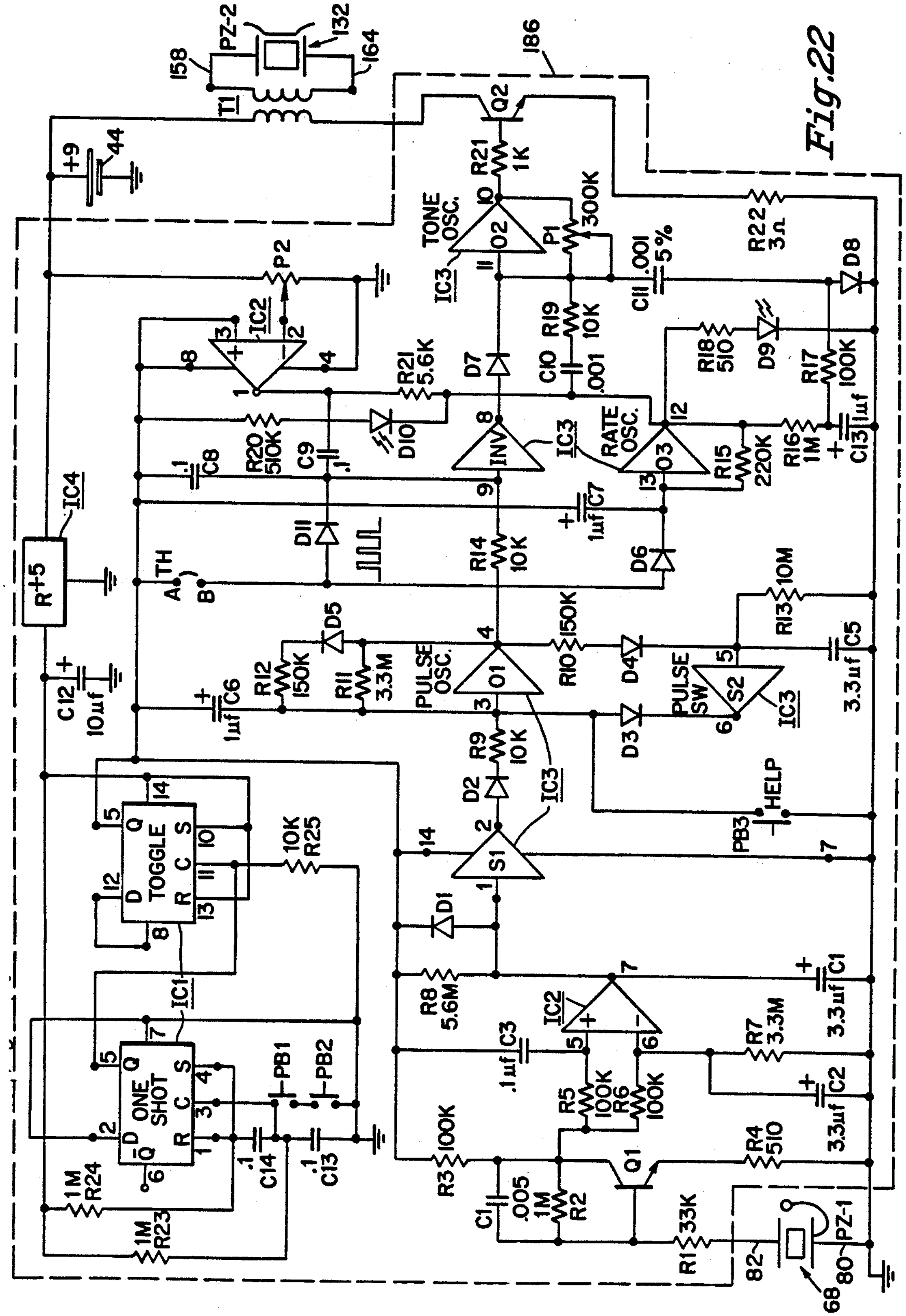
FIG. 22 is a schematic diagram of the electronic circuit of the alarm device and components shown in FIGS. 1–21.

With reference to FIG. 22, the circuitry and components for operating the unit 24 will be described. Exemplary values of resistance and capacitance, shown on the circuit diagram, are the values of an operative production device. The electronic circuit includes integrated circuits IC1, IC2, IC3 and IC4.

Two miniature microswitches PB-1 and PB-2 are mounted on the front of printed circuit board 186 with their spring loaded operator stems aligned with and close to associated ones of the elastomeric operating buttons 54 and 56 on the sides of the unit 24. A third miniature microswitch PB-3 is also mounted on the front of the printed circuit board with its spring loaded operator stem aligned with and close to the emergency call elastomeric button 58 seen in FIGS. 1 and 2.

Integrated circuit IC1 is a flip-flop circuit whose function is to turn the operational circuit ON/OFF when push buttons PB1 and PB2 are pushed simultaneously. Its designation part is 74HC74N. Integrated circuit IC2 is a comparator circuit whose function is to clip the amplified signal at the collector of transistor Q1, and to monitor the condition of battery 44, causing a "low" battery alarm to sound when the battery voltage becomes too low for reliable operation. Its designation part is LM393. The integrated circuit IC3 is the main processing circuit whose function is to perform timing and sound generating signals. This circuit consists of 6 level detecting elements with terminals: 1,2; 3,4; 5,6; 9,8; 11,10; and 13,12. Its designation part is 74HC14N. Integrated circuit IC4 is a precision voltage regulator whose function is to insure a constant voltage for the circuit as battery voltage drops due to use.

THEORY OF OPERATION

In FIG. 22, at the upper right hand corner, the 9 volt battery 44 provides power to the power amplifier, Q2, and to the voltage regulator IC4. The output voltage of IC4 is a 5 volt DC voltage that will remain constant as the battery voltage falls due to use. Capacitor C12 serves to subdue any oscillations that may occur due to the loading of IC4.

TURNING THE CIRCUIT ON/OFF. Integrated circuit IC1 serves as an electronic ON/OFF switch for the system. Pin 9 provides either +5 volts or 0 volts when push buttons PB1 and PB2 are simultaneously pushed. Resistors R23 and R24 provide a charge path for capacitors C13 and C14. The signal appearing at pin 5 is a pulse of uniform width that causes the toggle portion of this circuit to turn ON or OFF when this pulse is applied to pin 11. Resistor R25 acts as a load resistor for the applied pulse.

WHEN MOTION OF THE USER OCCURS, a damped sine wave electrical signal is generated by the vibrating accelerometer 68, (see FIG. 13) and the signal is applied through R1 to the base of voltage amplifier Q1. Resistors R1, R2 and R4 control the amplification of Q1. Capacitor C1 acts as a feed back filter element permitting only low frequencies to be amplified. The signal appearing at the collector of Q1 is an amplified replica of the signal generated by the piezo electric vibrating accelerometer 68.

Resistors R5 and R6 in combination with capacitors C2 and C3 form a low pass filter that supplies a signal to terminals 5 and 6 of comparator IC2. Resistor R7 supplies the necessary offset bias so that a signal of at least 100 millivolts between terminals 5 and 6 of IC2 is required to drive pin 7 to ground. The presence of this signal assures the discharge of capacitor C4. Note that when no motion is present, pin 7 (representative of a back biased diode) is high and capacitor C4 is permitted to charge via charging resistor R8. Diode D1 acts as a discharge path for any voltage that may appear on capacitor C4 when the system is turned off.

WHEN NO MOTION OF THE USER IS PRESENT, the piezo motion detecting accelerometer 68 does not vibrate and will not generate any electrical signal. This condition permits capacitor C4 to charge via resistor R8 to a voltage that is sufficient for the voltage sensing switch S1 in integrated circuit OAK-3 (left hand side of IC3 in FIG. 22) to drive IC-3 pin 2 low, thus permitting pulse oscillator 01 of IC-3 to activate. Diode D2 in combination with resistor R9 act as control elements for the pulse generating oscillator 01. Resistor R11 and capacitor C6 set the time period at which pulse oscillator 01 oscillates. Diode D5 and resistor R12 establish the pulse width of the oscillator's output pulse that appears at pin 4 of IC3. The action of these pulses at pin 4 cause capacitor C5 to charge via current limiting resistor R10 and blocking diode D4. Resistor R13 acts as a discharge resistor for capacitor C5. Note that the pulses appearing at pin 4 are applied to the invertor element INV of IC-3 (pins 9 and 8) via resistor R14 such that an inverted replica of the pulses appear at the invertor pin 8. These pulses cause the anode side of control diode D7 to momentarily go to ground, thus activating the tone oscillator 02 of IC-3. This pulsed action of the tone oscillator 02 is coupled via resistor R21 to the base of power amplifier transistor Q2, then the amplified signal couples to the sound producing planar transducer 132 via transformer T1. These pulses are now perceived as a series of audible click-like sounds that serve as a momentary audio indicator that the pulse oscillator has been activated. Resistors R21 and R22 serve as current limiting elements for transistor Q2.

THE ALARM STATE. When a sufficient number of pulses are accumulated in capacitor C5 in a given time period, a voltage of sufficient magnitude will be reflected at pin 5 of pulse switch S2 causing the pulse switch output (pin 6) to fall to ground. This action drives (via blocking diode D3) pin 3 of the pulse oscillator to ground, its pin 4 is driven high, and the pulse oscillator ceases to generate pulses. This is the latch up condition necessary for alarm.

ALARM SOUND GENERATORS. The rate oscillator 03 of IC-3 (pins 13 and 12) in combination with the tone oscillator 02 (pins 11 and 10) generate a sweeping type audio signal that varies between 2 kHz and 3 kHz. The rate oscillator generates a square wave pulse at a rate of 2 pulses per second. Capacitor C7 in combination with resistor R15 establish this time period. Light emitting diodes (LED) D9 and D10, located behind the external lens 60 (FIGS. 1 and 2), flash in synchronism with rate oscillator 03. Resistors R18 and R20 act as current limiting elements for the LED'S.

The square wave appearing at pin 12 of the rate oscillator is converted into a triangle-like wave via resistor R16 and capacitor C13. This triangle-like sweep voltage is then applied to the tone oscillator's diode D8 via R17. The action of this sweep signal applied to diode D8 causes its dynamic conductance to vary. This change in conductance results in the tone oscillator changing frequency in synchronism with the sweeping voltage across D8.

Note that the rate oscillator runs continuously when power is applied, and diode D7 acts as the control element that permits the tone oscillator 02 to oscillate. When pin 8 of the invertor element INV is high, diode D7 conducts, resulting in pin 10 of the tone oscillator being low (oscillator inhibited). When the anode of diode D7 is low (pin 8), the tone oscillator activates. Potentiometer Pl in combination with capacitor C11 and diode D8 establish the mean frequency at which the tone oscillator runs. Capacitor C10 and resistor R19 act as an integrator for the square wave appearing at pin 12 of the rate oscillator, providing a portion of the modulation signal for the tone oscillator 02.

TEMPERATURE SENSING. High temperatures are sensed via a thermostat (TH). When the thermostat terminals A and B short due to thermostatic action, the rate oscillator 03 is inhibited via diode D6. Diode D11 becomes forward biased resulting in pin 8 of the invertor INV going to ground. This action results in only the tone oscillator 02 being activated thus producing a different audio signal for the presence of high temperature than the sweep type audio signal that indicates lack of motion.

LOW VOLTAGE ALARM. Battery use results in a decay of battery terminal voltage for alkaline type batteries. This decrease in terminal voltage is sensed by the comparator circuit IC2, terminal 2. Terminal 2 is connected to the battery voltage via a potentiometer P2, Terminal 3 of IC-2 is connected to the regulated supply via pin 9 of IC1 (power On/Off toggle). Pin 1 of IC2 is represented as a transistor whose collector is connected to pin 1 of IC2. When the battery voltage is greater than the regulated reference voltage applied to pin 3, the transistor equivalent operating at pin 1 will be at ground (output turned on). This action causes the square wave that appears at pin 12 to be shunted to ground via coupling resistor R21. As the battery ages, pin 1 will go high (collector of transistor equivalent) and the square wave will be applied via capacitor C9 to invertor chip terminal 9. This action results in invertor pin 8 momentarily going to ground, resulting in a series of audible tones that warn of low battery terminal voltage.

EMERGENCY CALL FUNCTION. Push button PB3 (center bottom part of FIG. 22) places a momentary ground on pin 3 of IC3 (pulse oscillator). This action causes pin 4 to latch high and the alarm sounds as described in the aforementioned discussion on alarm state. This alarm can be terminated by pressing the two buttons which control switches PB-1 and PB-2 to deactivate the circuit.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. A personal alert safety system having condition responsive sensor means and alarm means indicative of personal safety conditions comprising: a small size portable casing, said casing comprising an internal divided two part chamber, the first part being a watertight sealed cavity and the second part being a sound resonating cavity with surrounding walls including at least one sound port providing a passage from the interior to the exterior of said resonating cavity; a sealed flat wall means comprising a dividing wall between said two chamber parts; electric and electronic control and operating circuitry means disposed in said first part of said chamber including a source of electric power, two series connected, single pole, push button control switches each having "on" and "off" positions and being spring biased to the "off" position, and flip-flop electronic switching means controlled by said control switches to enable said circuitry means to be turned "on" and "off" respectively by a sequence of simultaneous operations of said two control switches; said sealed flat wall means comprising a thin flat sound generating piezoelectric transducer device electrically connected to said circuitry means; a motion detector, and means rigidly mounting said motion detector within said first part of said two part chamber, said motion detector generating a sine wave voltage output a characteristic of which changes responsive to motion of said casing; and said circuitry means further including a tone oscillator, a rate oscillator and an amplifier, connected between said motion detector and said piezoelectric sound generating transducer and responsive to the output of said motion detector to cause a specific high intensity sweeping alarm signal to be emitted when the circuitry means is turned on and in the event that the casing is motionless.

2. A personal alert safety system as defined in claim 1, wherein said motion detector is a vibrating accelerometer.

3. A personal alert safety system as defined in claim 1, further comprising: two sealed manual operating means located on opposite sides of said casing for actuating said two control switches.

4. A personal alert safety system as defined in claim 3, further comprising: a third emergency electric switch in said circuitry means and a sealed operating means for said third switch located in a wall of said casing; visual indicating means connected to said circuitry means; and a lens adjacent said visual indicating means located in said casing, said visual indicating means being rendered operable when said circuitry means is turned "on"; and said third switch, when actuated during the "on" condition of said control and operating circuitry means, operates a part of said circuitry means to cause a high intensity continuous tone sound to be generated by said piezoelectric sound generating transducer.

5. A personal alert safety system as defined in claim 1, further comprising: a thermocouple temperature responsive means, connected to said circuitry means, operable in response to high temperature to actuate a portion of said circuitry means to cause a predetermined high intensity constant level tone to be generated by said sound generating transducer device.

6. A personal alert safety system as defined in claim 1, wherein said flat sound generating transducer device comprises: a thin sealed laminated structure having at least two flat diaphragm means, all of which are bonded together, and include adjacent first flat diaphragm means and second flat diaphragm means; a hollow central flat air pocket defined by portions of said adjacent first and second flat diaphragm means which provide upper and lower flat walls for said pocket, at least a first one of said upper and lower flat walls comprising a thin metal substrate on said first flat diaphragm means; a thin piezoelectric wafer; electrically conductive bonding means rigidly bonding said piezoelectric waver to said thin metal substrate within said pocket; a first electric conductor lead electrically bonded to said piezoelectric wafer and passing through a hole in said second flat diaphragm means; sealing means, at said hole, sealing the first electric conductor lead to said second flat diaphragm means through which it passes; and a second electric conductor lead electrically bonded to said thin metal substrate; said central pocket being a sealed air pocket which insures uniform distribution of sound energy from said piezoelectric wafer over a surface of the flat sound generating transducer device; and said first and second conductor leads being connected to said amplifier.

7. A personal alert safety system as defined in claim 6, wherein all of said diaphragm means are rectangular and are the same rectangular size.

8. A personal alert safety system as defined in claim 7, wherein said first flat diaphragm means is a copper clad flat thin fiberglass board with a round opening in a central portion thereof, said opening extending from an exterior side of said first flat diaphragm means to an interior side thereof; said thin metal substrate is a brass disc electrically conductively bonded to said copper cladding on said exterior side of said first flat diaphragm means which seals said opening at said exterior side in water tight manner; said second flat diaphragm means is a flat thin fiberglass board securely attached to the interior side of said first flat diaphragm means to provide with said brass disc and said first flat diaphragm means, at the round opening therein, said central sealed flat air pocket; and said piezoelectric wafer is electrically bonded to said brass disc inside of said central flat pocket.

9. A personal alert safety system as defined in claim 7, wherein said first flat diaphragm means is a thin brass plate with a central depression providing a flat recessed surface spaced from the flat wall provided by said portion of said second flat diaphragm means to provide therewith said control flat air pocket; and said piezoelectric wafer is electrically bonded to said flat recessed surface.

10. A personal alert safety system as defined in claim 7, wherein said casing is a rigid plastic casing having a box-like configuration with parallel top and bottom walls, two parallel side walls and one end wall; said sealed laminated structure having at least two flat diaphragm means constituting said sealed flat wall means and being disposed within said casing adjacent said bottom wall and between and engaging said two side walls and engaging a portion of said bottom wall and inclined up from said bottom wall toward and in engagement with a lower portion of said end wall; and said personal alert safety system further comprising second sealing means securely bonding said laminated structure to said side walls, said bottom wall and said end wall to thereby form said sound resonating cavity in the proximity of the bottom wall of said casing; and said at least one sound port comprises a plurality of sound ports provided in the portions of said casing walls which are part of said resonating cavity.

11. A personal alert safety system as defined in claim 6, wherein said motion detector is a vibrating accelerometer and comprises: an integral combination of an interconnected flexible thin metal substrate and a spring wire means mounted on a rigid support internal of said casing, said integral combination also including a weight mass, motion of which causes a vibratory flexing of said spring wire means and said flexible thin metal substrate; electric signal emitting means including means bonded to said flexible thin metal substrate and responsive to said vibratory flexing of said flexible thin metal substrate to generate a harmonic sine wave of voltage in said electric signal emitting means indicative of movement of said rigid support; and two electrical conductors connecting said signal emitting means to said circuitry means.

12. A personal alert safety system as defined in claim 11, wherein said means bonded to said flexible thin metal substrate is a layer of piezoelectric material, and a second electrically conductive bonding means bonds said piezoelectric material to said flexible thin metal substrate; said two electrical conductors comprise two electric conductor leads, one of said leads being electrically bonded to a surface of said layer of piezoelectric material, and the other of said leads being electrically bonded to said flexible thin metal substrate, whereby flexing of said piezoelectric material due to flexing of said flexible thin metal substrate generates a sine wave of voltage between said two conductor leads.

13. A personal alert safety system as defined in claim 2, wherein said motion detector comprises: an interconnected flexible thin metal substrate and a spring wire means mounted on a rigid support internal of said casing, said motion detector further comprising: a weight mass, motion of which causes a vibratory flexing of said spring wire means and said flexible thin metal substrate; electric signal emitting means including means bonded to said flexible thin metal substrate and responsive to said vibratory flexing of said flexible thin metal substrate to generate a harmonic sine wave of voltage in said electric signal emitting means indicative of movement of said rigid support; and two electrical conductors connecting said signal emitting means to said circuitry means.

14. A personal alert safety system as defined in claim 13, wherein said means bonded to said flexible thin metal substrate is a layer of piezoelectric material, and electrically conductive bonding means bonds said piezoelectric material to said flexible thin metal substrate; said two electrical conductors comprise two electric conductor leads, one of said leads being electrically bonded to a surface of said layer of piezoelectric material, and the other of said leads being electrically bonded to said flexible thin metal substrate, whereby flexing of said piezoelectric material generates a sine wave of voltage between said two conductor leads.

15. A personal alert safety system as defined in claim 14, wherein said thin flexible metal substrate and said rigid support comprise an integral sheet metal brass housing having a thin flat top wall, which constitutes said flexible thin metal substrate, and rear and side walls and a base constituting said support rigidly secured to the casing; edge parts of the side walls and base on a front side of said brass housing constitute the peripheral edges of a small opening; and said spring wire means is a straight elongate piece of spring wire, with two ends, projecting into said housing through said small opening with electrically conductive bonding means rigidly securing one end of said spring wire means to an interior surface of said thin flat top wall adjacent said rear wall of said brass housing, the other end of said spring wire means extending out through, and spaced away from the peripheral edges of, said opening; and said weight mass is a small ball mass secured to said other end of said spring wire means, whereby relative movement of said casing and said ball mass causes harmonic flexing of said spring wire means, said thin flat top wall and said layer of piezoelectric material being fastened thereto.

16. A personal alert safety system as defined in claim 14, wherein said thin flexible metal substrate is a narrow elongate flat strip of brass; said spring wire means is a piece of spring wire with two ends; electrically conductive bonding means rigidly secures one end of said narrow strip of brass to one end of said piece of spring wire and the other end of said piece of spring wire is rigidly connected to said rigid support internal of said casing; and said weight mass is a small ball mass secured to the other end of said narrow strip of brass whereby relative movement of said casing and said ball mass causes a harmonic motion of said brass strip, via said wire spring, resulting in harmonic flexing of said brass strip and the layer of piezoelectric material bonded thereto.

17. A personal alert safety system as defined in claim 13, wherein said means bonded to flexible thin metal substrate is a fabricated thin structural portion of said electric signal emitting means constituting a layer of an elongate strip of electrically conductive variable resistance means with two ends, the resistance of which between said two ends changes due to flexing of said layer; non-conductive bonding means secures said fabricated strip of electrically conductive resistance means to said flexible thin metal substrate; said power source includes a source of D.C. voltage and said electric signal emitting means includes a connection to said source of D.C. voltage wherein a series electrical connection exists between said voltage source, a constant resistance and the two ends of said strip of electrically conductive variable resistance means, said constant resistance and said resistance means in series providing a voltage divider whereby the voltage signal between the two ends of said strip of variable resistance means will vary as a sine wave voltage output signal when the resistance of said strip of electrically conductive resistance means undergoes changes of resistance due to flexing of said flexible thin metal substrate as a result of vibration caused by relative motion between said weight mass and said rigid support structure.

18. A personal alert safety system as defined in claim 17, wherein said thin flexible metal substrate is a narrow elongate flat strip of brass; said spring wire means is a piece of spring wire with two ends; electrically conductive bonding means rigidly secures one end of said narrow strip of brass to one end of said piece of spring wire and the other end of said piece of spring wire is rigidly connected to said rigid support internal of said casing; and said weight mass is a small ball mass secured to the other end of said narrow strip of brass whereby movement of said ball mass causes a harmonic motion of said brass strip, resulting in flexing of said brass strip and the layer of an elongate strip of electrically conductive resistance means bonded thereto.

19. A personal alert safety system as defined in claim 18, wherein said layer of an elongate strip of electrically conductive resistance means is a fabricated strip of a plurality of spaced-apart small copper blocks and a conductive resistance material comprising a mixture of carbon grains disposed in conductive relationship between adjacent copper blocks, said fabricated strip being bonded to a non-conductive plastic foil and said plastic foil being adhesively bonded to said flexible brass strip; end ones of said small copper blocks constituting terminals for said series connection of said strip of conductive resistance means with the constant resistance and said voltage source, which are respectively connected to said two electrical conductors which connect to said circuitry means.

20. A personal alert safety system as defined in claim 19, wherein said copper block has a dimension of approximately 1 mil×3 mil×0.3 mil and the space between adjacent copper blocks in which the carbon grain mixture is disposed in approximately 1 mil wide; a conductive jumper connects the copper block at one end of the fabricated strip to said brass strip; and the copper block at the other end of said fabricated strip has one of said electrical conductors bonded thereto and the brass strip is electrically connected to the second of said electrical conductors.

21. A personal alert safety system as defined in claim 13, wherein said spring wire means is a C-shaped piece of spring wire, one end of the C-shaped piece being electrically bonded to said flexible thin metal substrate and the other end of the C-shaped piece being secured to said rigid support; and said weight mass is a small ball mass.

* * * * *

UNITED STATES PATENT AND TRADEMARK OFFICE
CERTIFICATE OF CORRECTION

PATENT NO. : 5,317,305

DATED : May 31, 1994

INVENTOR(S) : JAMES P. CAMPMAN

It is certified that error appears in the above-identified patent and that said Letters Patent is hereby corrected as shown below:

IN THE CLAIMS:

Column 20, line 39, "said" should be --each--.

Signed and Sealed this

Sixth Day of September, 1994

Attest:

BRUCE LEHMAN

*Attesting Officer*

*Commissioner of Patents and Trademarks*